(12) United States Patent
Itayama et al.

(10) Patent No.: US 12,727,388 B2
(45) Date of Patent: Sep. 1, 2026

(54) PIEZOELECTRIC ELEMENT INCLUDING DIFFUSION INHIBITION LAYER BETWEEN SUBSTRATE AND PIEZOELECTRIC LAYER, AND PIEZOELECTRIC ELEMENT APPLICATION DEVICE

(71) Applicant: SEIKO EPSON CORPORATION, Tokyo (JP)

(72) Inventors: Yasuhiro Itayama, Kai (JP); Yasuhiro Horiba, Shiojiri (JP); Masahiro Takeuchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 775 days.

(21) Appl. No.: 18/192,325

(22) Filed: Mar. 29, 2023

(65) Prior Publication Data

US 2023/0320218 A1 Oct. 5, 2023

(30) Foreign Application Priority Data

Mar. 31, 2022 (JP) ................................ 2022-057916

(51) Int. Cl.

| | |
|---|---|
| ***H10N 30/00*** | (2023.01) |
| ***B41J 2/14*** | (2006.01) |
| ***H10N 30/20*** | (2023.01) |
| ***H10N 30/853*** | (2023.01) |

(52) U.S. Cl.

CPC ........ *H10N 30/708* (2024.05); *B41J 2/14201* (2013.01); *H10N 30/2047* (2023.02); *H10N 30/8542* (2023.02)

(58) Field of Classification Search

CPC ............ H10N 30/708; H10N 30/2047; H10N 30/8542; H10N 30/079; B41J 2/14201; B41J 2/14233; B41J 2002/14241; B41J 2002/14362; B41J 2002/14491; B41J 2202/03

See application file for complete search history.

(56) References Cited

U.S. PATENT DOCUMENTS

| | | | | |
|---|---|---|---|---|
| 2011/0273517 | A1* | 11/2011 | Miyazawa | B41J 2/1646 347/68 |
| 2018/0233656 | A1 | 8/2018 | Kitada et al. | |
| 2021/0408361 | A1* | 12/2021 | Hamada | H10N 30/802 |

FOREIGN PATENT DOCUMENTS

| | | |
|---|---|---|
| JP | 2018-133458 A | 8/2018 |

* cited by examiner

*Primary Examiner* — Emily P Pham
(74) *Attorney, Agent, or Firm* — Spencer Fane LLP

(57) ABSTRACT

A piezoelectric element according to the present disclosure includes: a substrate containing silicon; a first electrode formed on the substrate; a piezoelectric layer formed on the first electrode and containing potassium, sodium, and niobium; and a second electrode formed on the piezoelectric layer, in which a first diffusion inhibition layer containing an insulating material is disposed between the substrate and the piezoelectric layer, the piezoelectric layer is continuously formed on a first region which is a surface of the first electrode, a second region which is a surface of the first diffusion inhibition layer, and a third region which is a surface of the substrate, and the third region is between the first region and the second region.

5 Claims, 9 Drawing Sheets

1
40
42
41
43
14
13
12
31
30
80
70
33
60
90
300
A
A'
X
Y
Z 1
40
42
41
100
32
15
20
43
14
13
12
120
300
B
B'
A-A'
60
80
21
70
31
10
121
33
90
51
52
50
30
35
Z
Y
X 300
80
70
60b
52
60
60a(A1)
60b
52
51(10)
52
12
11(10)
52a (A2)
51a (A3)
12
51a (A3)
52a (A2)
B-B'
X
Z
Y 300B
80
60b
57
70
52
60
60a(A1)
60b
52
51(10)
52
52a (A2)
51a (A3)
51a (A3)
52a (A2)
12
11(10)
12
B-B'
X
Z
Y

FIG. 8
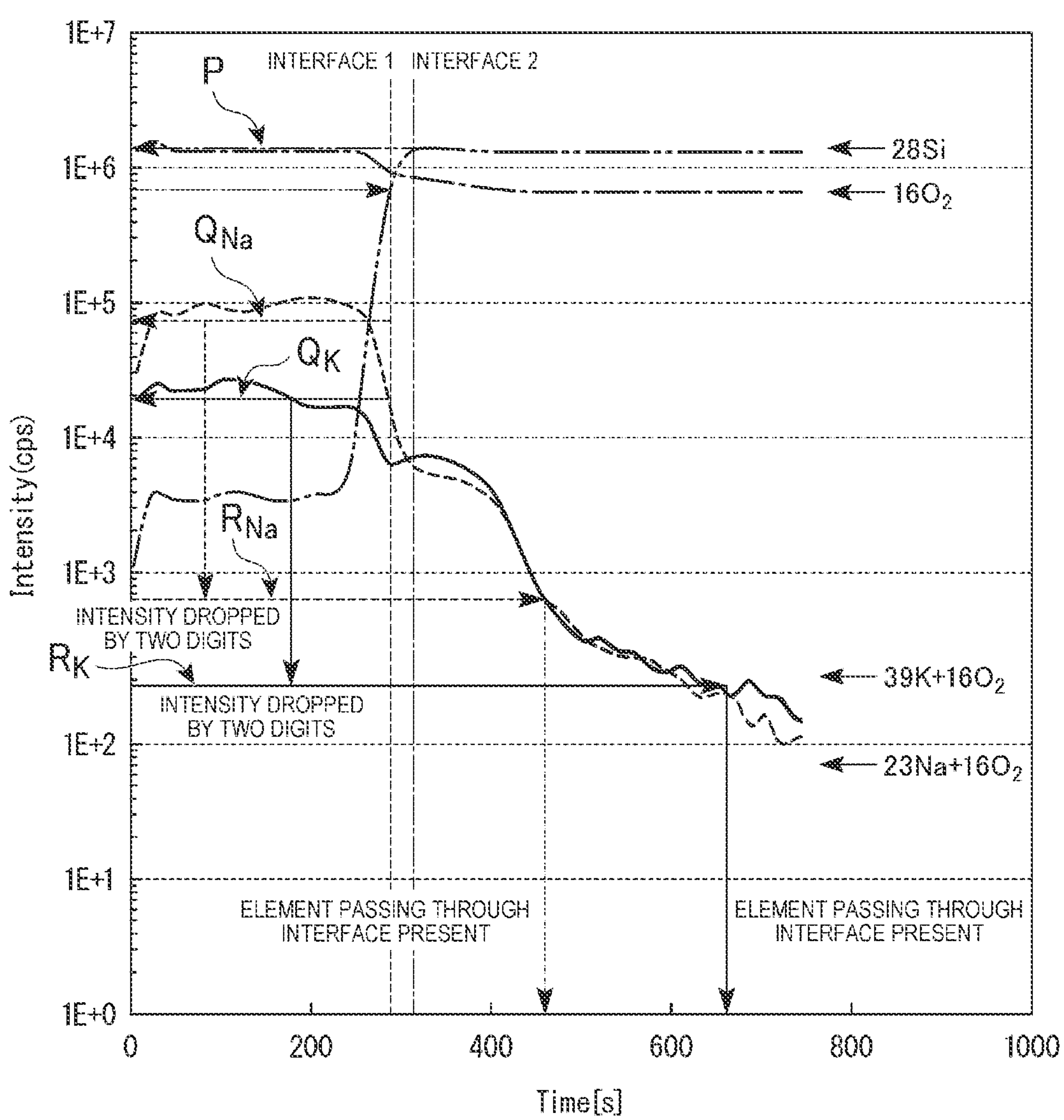

FIG. 9
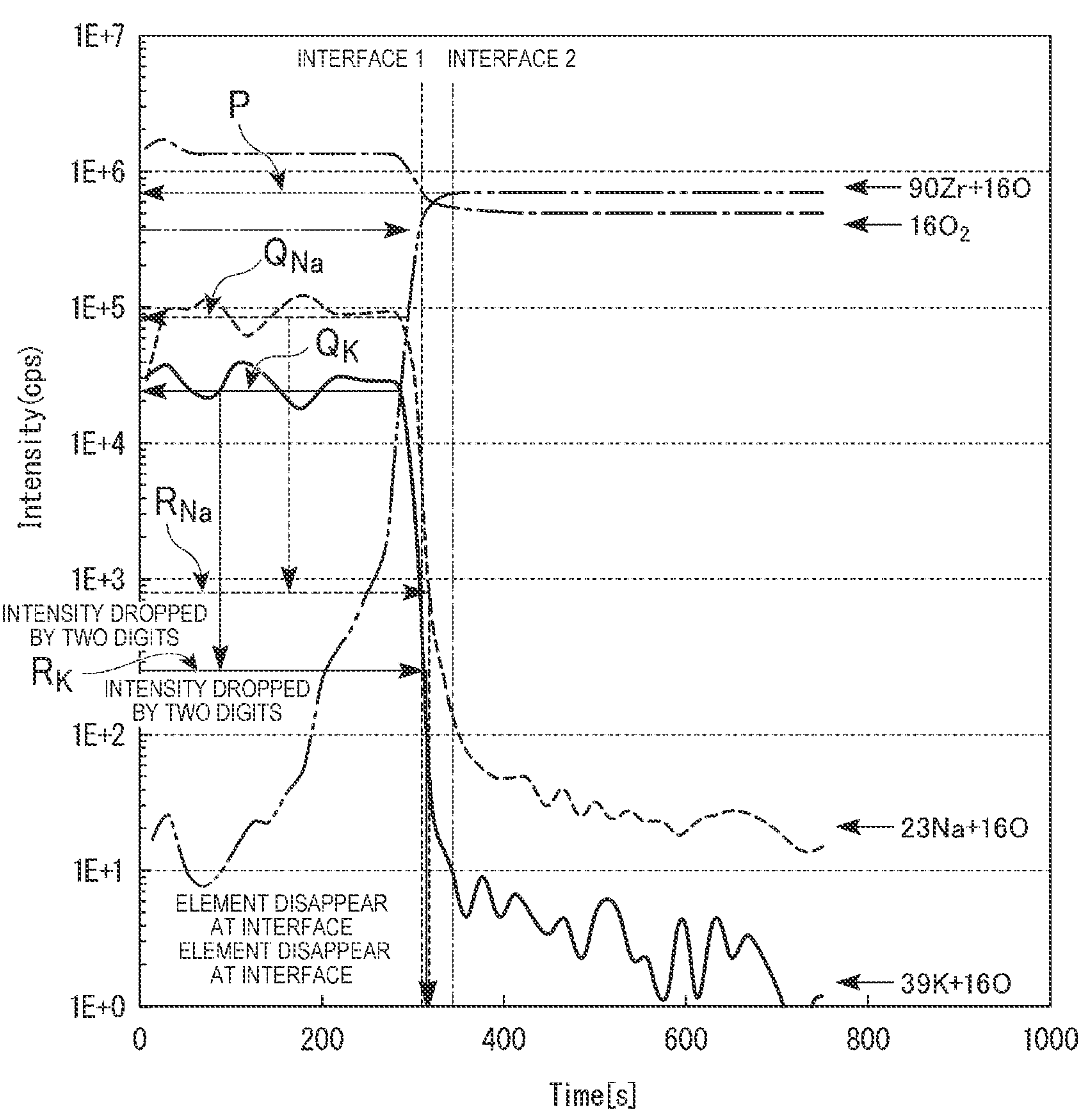
COMPARATIVE EXAMPLE 1
INTERFACE 1
INTERFACE 2
P
QNa
QK
RNa
RK
INTENSITY DROPPED BY TWO DIGITS
INTENSITY DROPPED BY TWO DIGITS
ELEMENT DISAPPEAR AT INTERFACE
ELEMENT DISAPPEAR AT INTERFACE
90Zr+16O
16O2
23Na+16O
39K+16O
Intensity(cps)
Time[s]
1E+7
1E+6
1E+5
1E+4
1E+3
1E+2
1E+1
1E+0
0
200
400
600
800
1000

PIEZOELECTRIC ELEMENT INCLUDING DIFFUSION INHIBITION LAYER BETWEEN SUBSTRATE AND PIEZOELECTRIC LAYER, AND PIEZOELECTRIC ELEMENT APPLICATION DEVICE

The present application is based on, and claims priority from JP Application Serial Number 2022-057916, filed Mar. 31, 2022, the disclosure of which is hereby incorporated by reference herein in its entirety.

BACKGROUND

1. Technical Field

The present disclosure relates to a piezoelectric element and a piezoelectric element application device.

2. Related Art

A piezoelectric element generally includes a substrate, a piezoelectric layer having an electromechanical conversion characteristic, and two electrodes sandwiching the piezoelectric layer. In recent years, development of devices (piezoelectric element application devices) using such a piezoelectric element as a driving source has been actively performed. One of the piezoelectric element application devices is a liquid ejection head represented by an ink jet recording head, a MEMS element represented by a piezoelectric MEMS element, an ultrasonic measurement device represented by an ultrasonic sensor, and further, a piezoelectric actuator device.

Lead zirconate titanate (PZT) is known as a material (piezoelectric material) for a piezoelectric layer of a piezoelectric element. In recent years, non-lead-based piezoelectric materials having a reduced lead content have been developed from the viewpoint of environmental loading reduction.

As one of the non-lead-based piezoelectric materials, for example, potassium sodium niobate (KNN; $(K,Na)NbO_3$) has been proposed as in JP-A-2018-133458.

Specifically, JP-A-2018-133458 discloses a piezoelectric element including a first electrode, a second electrode, and a thin-film piezoelectric layer provided between the first electrode and the second electrode and made of a perovskite composite oxide containing potassium, sodium, and niobium. JP-A-2018-133458 discloses a diaphragm including an elastic film made of silicon dioxide formed on a substrate and an insulator film made of zirconium oxide formed on the elastic film.

As described above, the piezoelectric element (KNN-based piezoelectric element) using KNN as one of non-lead-based piezoelectric materials has been proposed. However, in the KNN-based piezoelectric element according to the related art, cracks may occur at boundary surfaces among the insulator film constituting the diaphragm, the first electrode, and the piezoelectric layer, and foreign matters such as water may enter a crack from the outside. When foreign matters such as water enter the crack at the time of manufacturing the piezoelectric element or the like, a leakage current may be generated. As the piezoelectric element is driven, stresses are concentrated on the crack, and the piezoelectric element may be damaged.

When cracks occur at the boundary surfaces among the insulator film, the first electrode, and the piezoelectric layer, and when the second electrode formed at an upper part of the piezoelectric layer is formed, constituent material for the second electrode may enter the crack and conduct electricity.

In view of such circumstances, there is a demand for a KNN-based piezoelectric element capable of preventing occurrence of a crack.

Such a problem is not limited to a piezoelectric element used in a piezoelectric actuator mounted on a liquid ejection head represented by an ink jet recording head, but similarly in a piezoelectric element used in another piezoelectric element application device.

SUMMARY

A first aspect of the present disclosure provides a piezoelectric element including: a substrate containing silicon; a first electrode formed on the substrate; a piezoelectric layer formed on the first electrode and containing potassium, sodium, and niobium; and a second electrode formed on the piezoelectric layer, in which a first diffusion inhibition layer containing an insulating material is disposed between the substrate and the piezoelectric layer, the piezoelectric layer is continuously formed on a first region which is a surface of the first electrode, a second region which is a surface of the first diffusion inhibition layer, and a third region which is a surface of the substrate, and the third region is between the first region and the second region.

Another aspect of the present disclosure provides a piezoelectric element application device including: the piezoelectric element according to the above aspect.

BRIEF DESCRIPTION OF THE DRAWINGS

FIG. 8 is a diagram showing measurement results of secondary ion mass spectrometry in Example 1.

FIG. 9 is a diagram showing measurement results of secondary ion mass spectrometry in Comparative Example 1.

DESCRIPTION OF EXEMPLARY EMBODIMENTS

Figure 1:
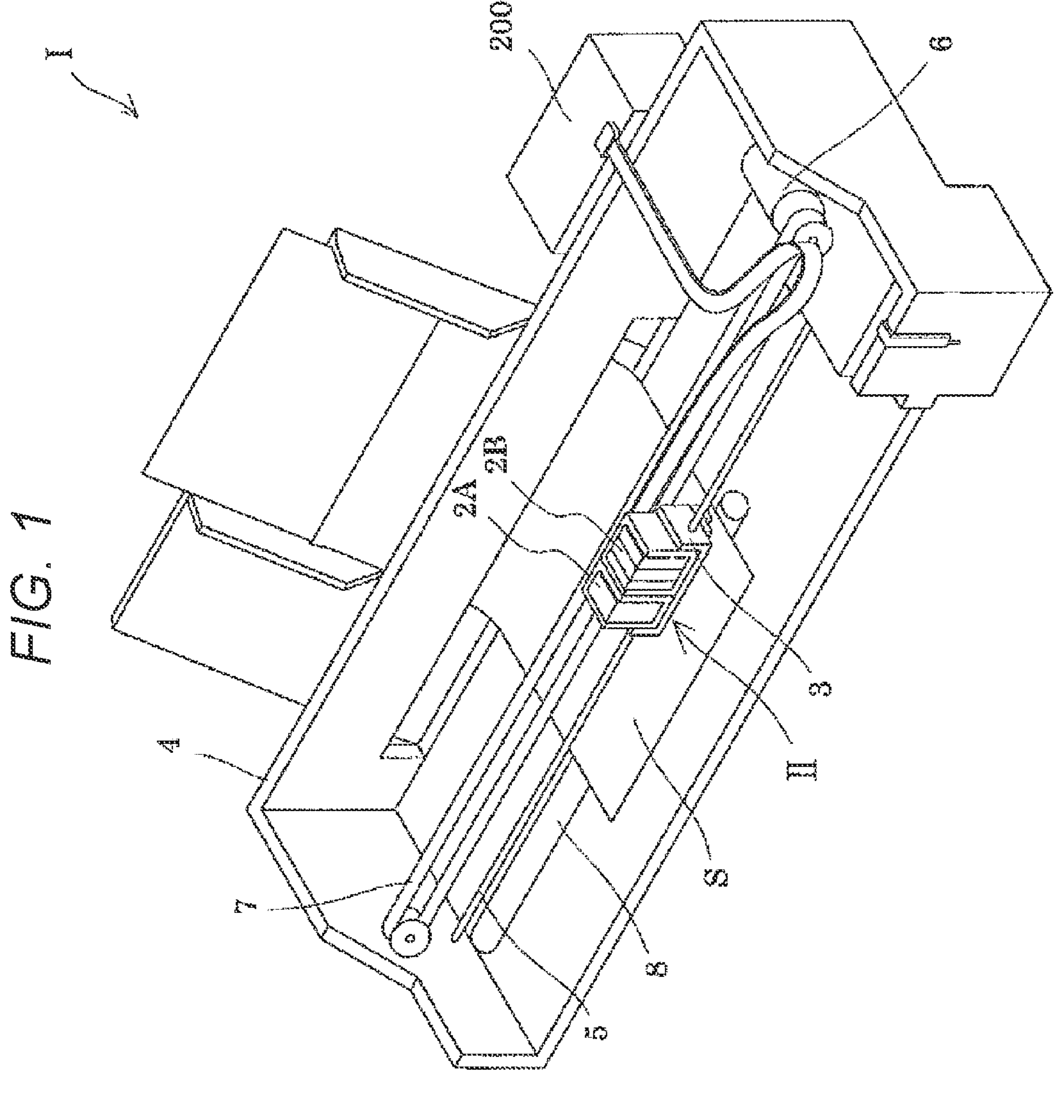
FIG. 1 is a perspective view showing a schematic configuration of a recording device according to a first embodiment.

Hereinafter, an embodiment of the present disclosure will be described with reference to the drawings. The following description shows an aspect of the present disclosure, and can be freely changed without departing from the gist of the present disclosure. In the drawings, the same reference signs denote the same members, and the description thereof is omitted as appropriate. The number after a letter which makes up the reference sign is referenced by a reference sign which includes the same letter and is used to distinguish between elements which have similar configurations. When it is not necessary to distinguish elements indicated by the reference signs which include the same letter from each other, each of the elements is referenced by a reference sign containing only a letter.

In each drawing, X, Y, and Z represent three spatial axes orthogonal to one another. In the present description, directions along these axes are referred to as a first direction X (X direction), a second direction Y (Y direction), and a third direction Z (Z direction), respectively, a direction of an arrow in each drawing is referred to as a positive (+) direction, and a direction opposite from the arrow is referred to as a negative (−) direction. The X direction and the Y direction represent in-plane directions of a plate, a layer, and a film, and the Z direction represents a thickness direction or a stacking direction of a plate, a layer, and a film.

Components shown in each drawing, that is, a shape and size of each part, a thickness of a plate, a layer, and a film, a relative positional relation, a repeating unit, and the like may be exaggerated for describing the present disclosure. Furthermore, the term "on" in the present description does not limit that a positional relation between the components is "directly on". For example, expressions such as "a first electrode on a substrate" and "a piezoelectric layer on the first electrode", which will be described later, do not exclude those including other components between the substrate and the first electrode or between the first electrode and the piezoelectric layer.

First Embodiment

Piezoelectric Element Application Device

First, an ink jet recording device, which is an example of a liquid ejection device including a recording head according to a first embodiment of the present disclosure, will be described with reference to the drawings. The liquid ejection device is an example of a piezoelectric element application device. FIG. 1 is a perspective view showing a schematic configuration of the ink jet recording device.

As shown in FIG. 1, in an ink jet recording device (recording device) I, an ink jet recording head unit (head unit) II is detachably provided in cartridges 2A and 2B. The cartridges 2A and 2B constitute an ink supply unit. The head unit II includes a plurality of ink jet recording heads (recording heads) 1 (see FIG. 2 and the like) to be described later, and is mounted on a carriage 3. The carriage 3 is movable in an axial direction on a carriage shaft 5 attached to a device main body 4. The head unit II and the carriage 3 can eject, for example, a black ink composition and a color ink composition, respectively.

A driving force of a drive motor 6 is transmitted to the carriage 3 via a plurality of gears (not shown) and a timing belt 7, so that the carriage 3 on which the head unit II is mounted is moved along the carriage shaft 5. On the other hand, the device main body 4 is provided with a conveyance roller 8 as a conveyance unit, and a recording sheet S which is a recording medium such as paper is conveyed by the conveyance roller 8. The conveyance unit which conveys the recording sheet S is not limited to a conveyance roller, and may be a belt, a drum, or the like.

In each of the recording heads 1, a piezoelectric element 300 (see FIG. 2 and the like), which will be described in detail later, is used as a piezoelectric actuator device. By using the piezoelectric element 300, it is possible to avoid deterioration of various characteristics (durability, ink ejection characteristics, and the like) in the recording device I.

Figure 2:
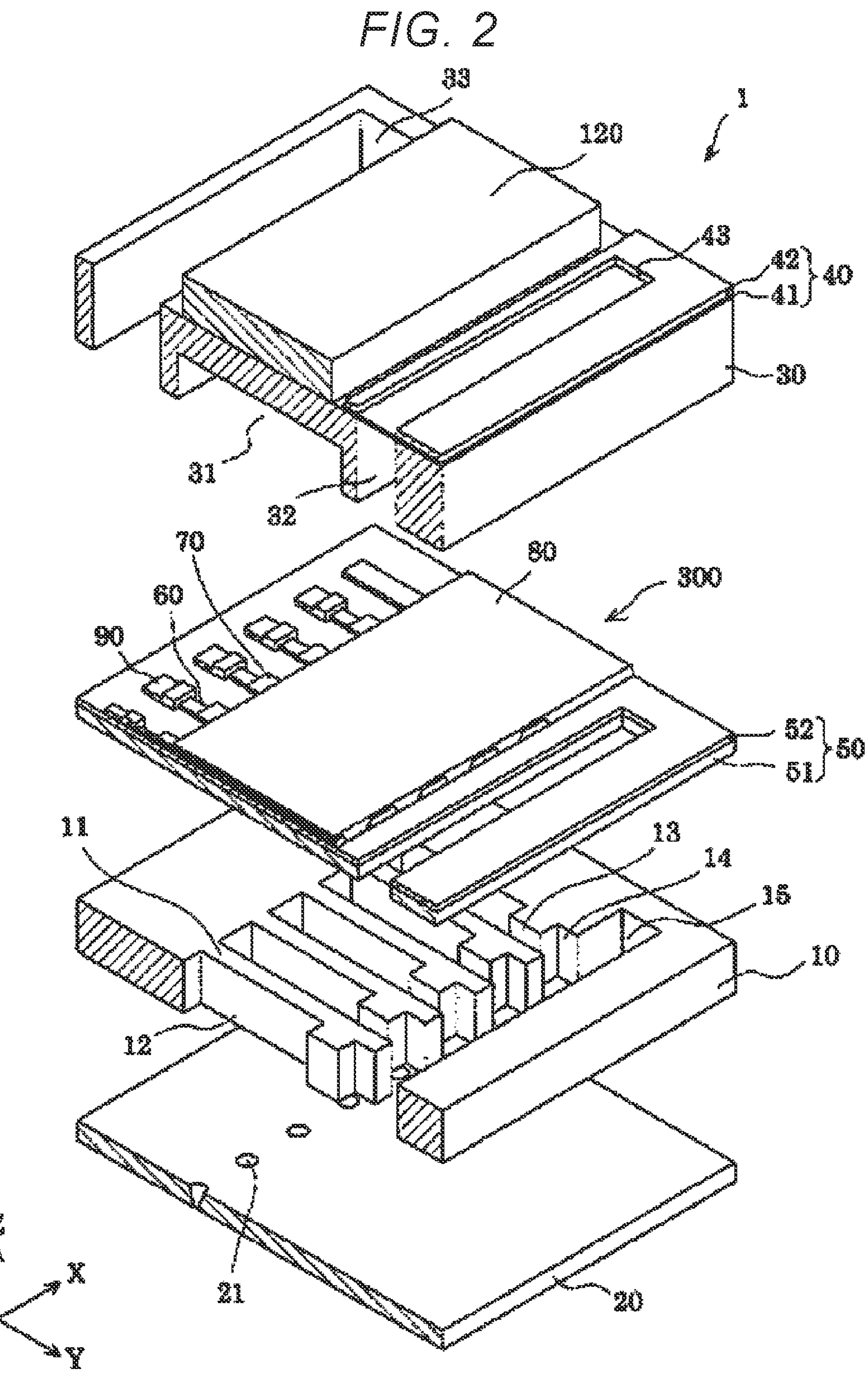
FIG. 2 is an exploded perspective view of a recording head of the recording device in FIG. 1.
Figure 3:
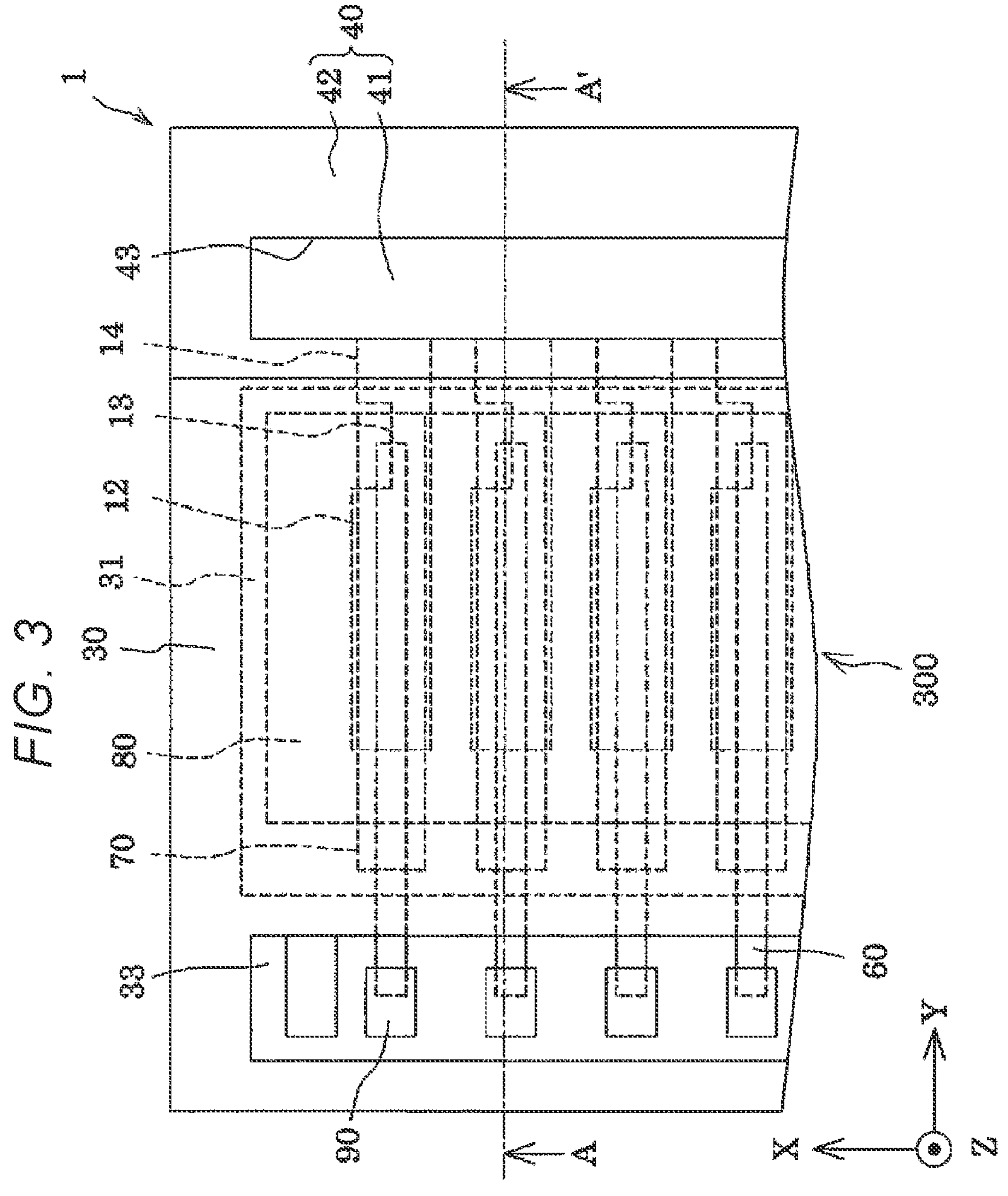
FIG. 3 is a plan view of the recording head of the recording device in FIG. 1.
Figure 4:
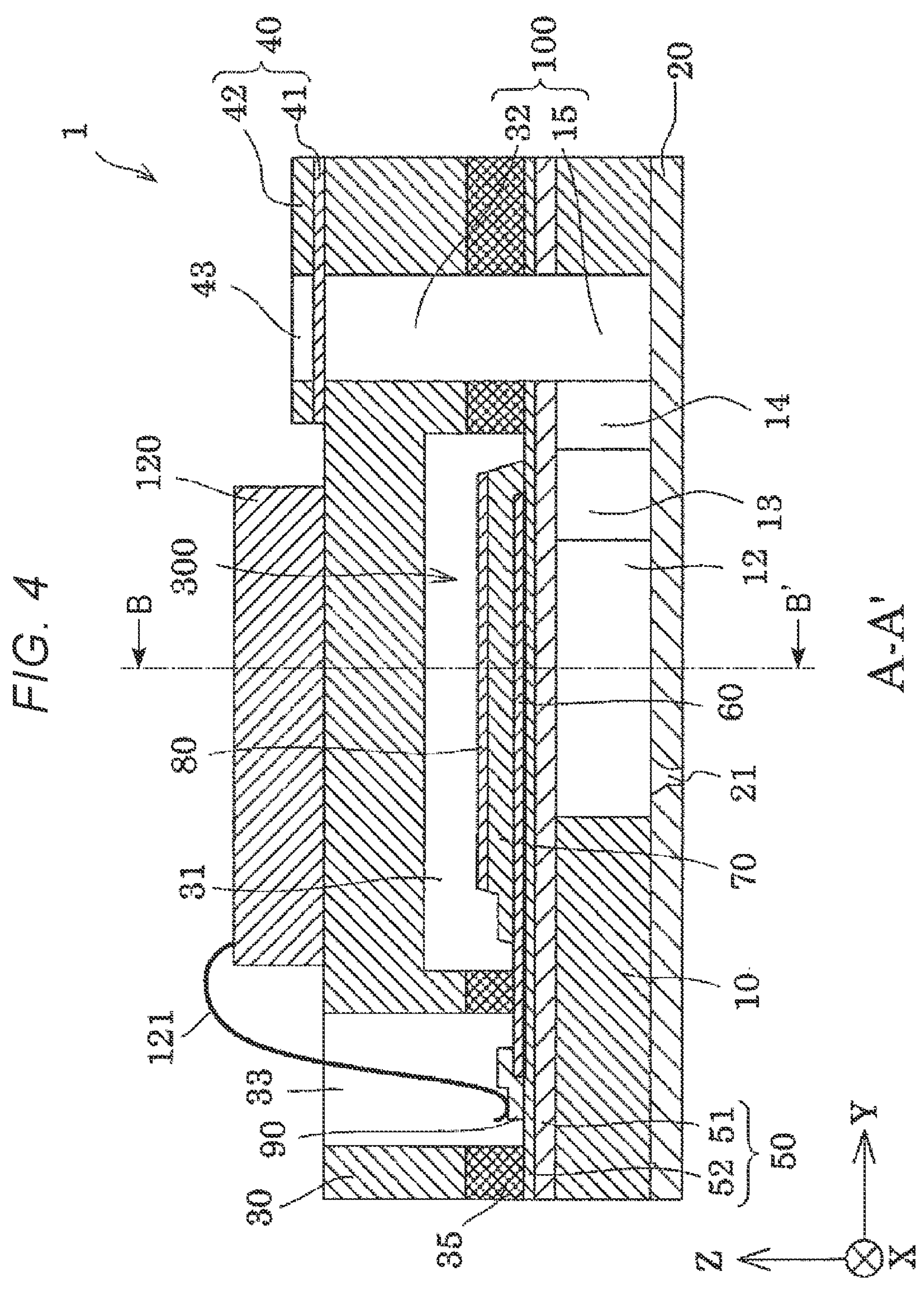
FIG. 4 is a cross-sectional view of the recording head of the recording device in FIG. 1.

Next, the recording head 1, which is an example of a liquid ejection head mounted on the liquid ejection device, will be described with reference to the drawings. FIG. 2 is an exploded perspective view showing a schematic configuration of the ink jet recording head. FIG. 3 is a plan view showing the schematic configuration of the ink jet recording head. FIG. 4 is a cross-sectional view taken along a line A-A' in FIG. 3. FIGS. 2 to 4 each show a part of a configuration of the recording head 1, and are omitted as appropriate.

As shown in the drawing, a flow path forming substrate (substrate) 10 contains silicon (Si). For example, the substrate 10 is made of a silicon (Si) single crystal substrate.

Pressure generation chambers 12 partitioned by a plurality of partition walls 11 are formed in the substrate 10. The pressure generation chambers 12 are arranged side by side along a direction (+X direction) in which a plurality of nozzle openings 21 for ejecting ink of the same color are arranged side by side.

In the substrate 10, ink supply paths 13 and communication paths 14 are formed at one end portion side (+Y direction side) of each of the pressure generation chambers 12. Each of the ink supply paths 13 is formed such that an area of an opening at the one end portion side of the pressure generation chamber 12 is reduced. Each of the communication paths 14 has substantially the same width as the pressure generation chamber 12 in the +X direction. A communication portion 15 is formed at an outer side (+Y direction side) of the communication path 14. The communication portion 15 constitutes a part of a manifold 100. The manifold 100 serves as a common ink chamber for each pressure generation chamber 12. Thus, a liquid flow path including the pressure generation chamber 12, the ink supply path 13, the communication path 14, and the communication portion 15 is formed in the substrate 10.

On one surface (a surface on a −Z direction side) of the substrate 10, a nozzle plate 20 made of, for example, SUS is bonded. In the nozzle plate 20, the nozzle openings 21 are arranged side by side along the +X direction. The nozzle openings 21 communicate with the pressure generation chambers 12. The nozzle plate 20 can be bonded to the substrate 10 by an adhesive, a thermal welding film, or the like.

A diaphragm 50 is formed on the other surface (a surface at a +Z direction side) of the substrate 10. The diaphragm 50 includes, for example, an elastic film 51 formed on the substrate 10 and an insulator film (first diffusion inhibition layer) 52 formed on the elastic film 51. The elastic film 51 is made of, for example, silicon dioxide ($SiO_2$), and the first diffusion inhibition layer 52 is made of, for example, zirconium oxide ($ZrO_2$).

Figure 5:
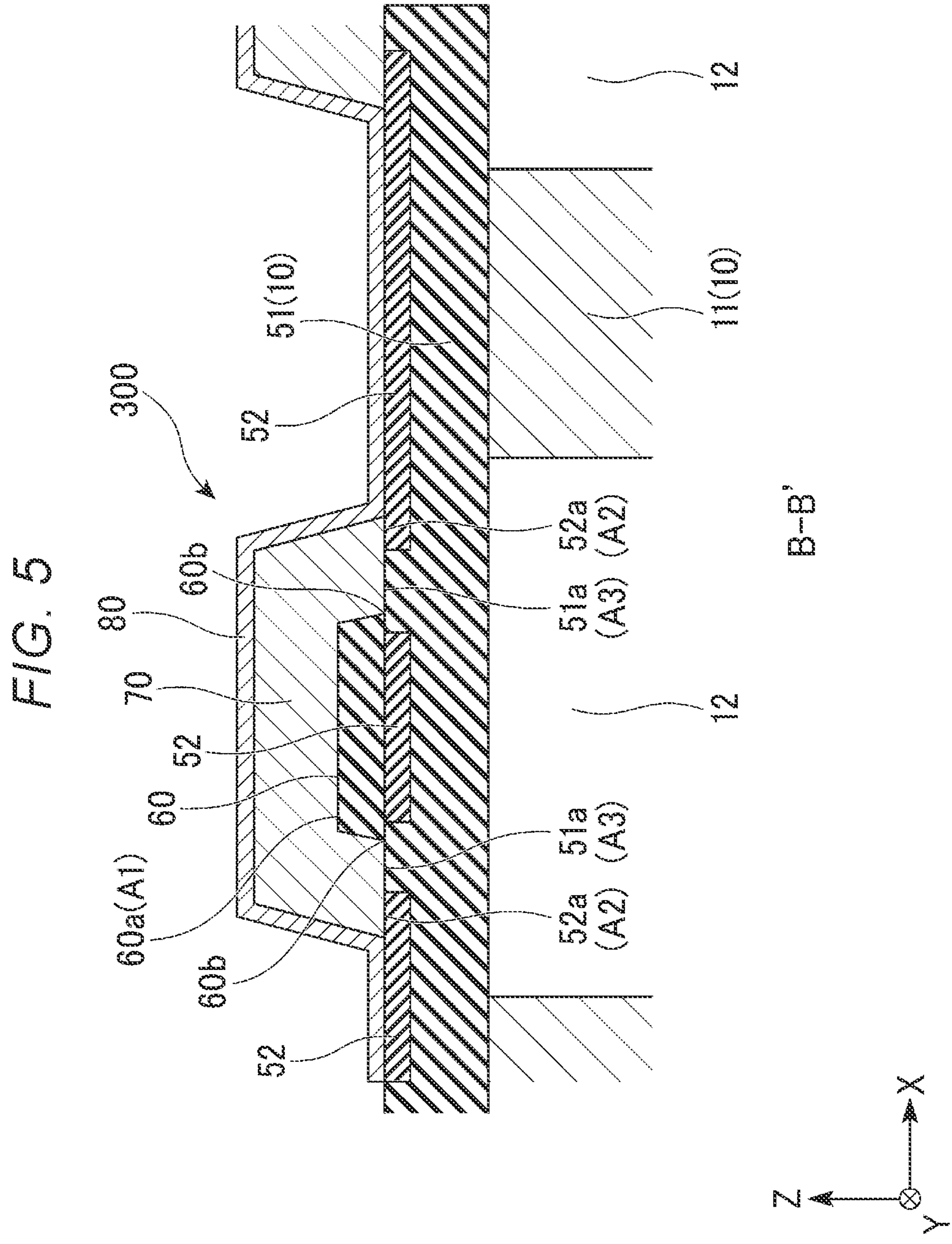
FIG. 5 is an enlarged cross-sectional view taken along a line B-B' in FIG. 4.

The elastic film 51 may not be a separate member from the substrate 10. A part of a surface layer (including a surface) at the +Z direction side of the substrate 10 may be processed to be thin and used as the elastic film 51. In the present description, one or both of the substrate 10 and the elastic film 51 may be referred to as a "substrate containing silicon". In FIG. 5 to be described later, an example in which the elastic film 51 and the first diffusion inhibition layer 52 are stacked on/above a surface at the other surface (the surface at the +Z direction side) side of the substrate 10 is shown. Alternatively, the substrate 10 and the elastic film 51 may be integrated.

First electrodes 60, piezoelectric layers 70, and a second electrode 80 are sequentially formed on/above the first diffusion inhibition layer 52 and the substrate containing silicon (the substrate 10 and/or the elastic film 51) via an adhesion layer. Each of the first electrodes 60 may be formed via an adhesion layer (not shown). In this case, the adhesion layer is made of, for example, titanium oxide ($TiO_x$), titanium (Ti), or SiN, and has a function of improving adhesion between the piezoelectric layers 70 and the diaphragm 50. The adhesion layer may be omitted.

Each of the piezoelectric layers 70 is made of a so-called KKK-based material containing potassium, sodium, and niobium, and these alkali metals may diffuse into the first electrode 60 in a process of forming the piezoelectric layer 70. Therefore, by providing the first diffusion inhibition layer 52 between the first electrode 60 and the substrate 10 and causing the first diffusion inhibition layer 52 to function as a stopper, the alkali metals constituting the piezoelectric layer 70 can be prevented from reaching the substrate 10. Details of the piezoelectric layer 70 and the first diffusion inhibition layer 52 will be described later.

The first electrode 60 are provided for each pressure generation chamber 12. That is, the first electrode 60 is provided as an individual electrode for the pressure generation chamber 12. The first electrode 60 has a width smaller than a width of the pressure generation chamber 12 in the +X direction and in a −X direction. The first electrode 60 has a width larger than a width of the pressure generation chamber 12 in a +Y direction and in a −Y direction. That is, in the +Y direction and in the −Y direction, both end portions of the first electrode 60 are formed up to an outside of a region on the diaphragm 50 facing the pressure generation chamber 12. Lead electrodes 90 are coupled to one end portion side (an opposite side from the communication path 14) of the first electrode 60.

Although not provided in the embodiment, for example, a seed layer (also referred to as an orientation control layer) may be provided between the first electrode 60 and the piezoelectric layer 70. When the adhesion layer is formed, a seed layer may be provided on the adhesion layer. The seed layer has a function of controlling orientation of a crystal of a piezoelectric substance constituting the piezoelectric layer 70. That is, by providing the seed layer, it is possible to preferentially orient the crystal of the piezoelectric substance constituting the piezoelectric layer 70 in predetermined orientation.

The piezoelectric layer 70 is provided between the first electrode 60 and the second electrode 80. The piezoelectric layer 70 is a thin-film piezoelectric substance. The piezoelectric layer 70 has a width larger than the width of the first electrode 60 in the +X direction and in the −X direction. The piezoelectric layer 70 has a width larger than a length of the pressure generation chamber 12 in the +Y direction and in the −Y direction. An end portion of the piezoelectric layer 70 at an ink supply path 13 side (+Y direction side) is formed up to an outside of an end portion of the first electrode 60 at the +Y direction side. That is, the end portion of the first electrode 60 at the +Y direction side is covered with the piezoelectric layer 70. On the other hand, an end portion of the piezoelectric layer 70 at a lead electrode 90 side (−Y direction side) is at an inner side (+Y direction side) of an end portion of the first electrode 60 at the −Y direction side. That is, the end portion of the first electrode 60 at the −Y direction side is not covered with the piezoelectric layer 70.

The second electrode 80 is continuously provided on the piezoelectric layer 70 and the diaphragm 50 over the +X direction. That is, the second electrode 80 is configured as a common electrode common to the plurality of piezoelectric layers 70. In the embodiment, the first electrode 60 constitutes an individual electrode provided independently corresponding to the pressure generation chamber 12, and the second electrode 80 constitutes a common electrode provided continuously in a direction in which the pressure generation chambers 12 are arranged side by side. Alternatively, the first electrode 60 may constitute the common electrode, and the second electrode 80 may constitute the individual electrode.

In the embodiment, the diaphragm 50 and the first electrode 60 are displaced by displacement of the piezoelectric layer 70 having an electromechanical conversion characteristic. That is, the diaphragm 50 and the first electrode 60 substantially function as a diaphragm. In practice, since the second electrode 80 is also displaced due to displacement of the piezoelectric layer 70, a region in which the diaphragm 50, the first electrode 60, the piezoelectric layer 70, and the second electrode 80 are sequentially stacked functions as a movable portion (also referred to as a vibration portion) of the piezoelectric element 300.

On the substrate 10 (diaphragm 50) on which the piezoelectric element 300 is formed, a protective substrate 30 is bonded by an adhesive 35. The protective substrate 30 has a manifold portion 32. At least a portion of the manifold 100 is implemented by the manifold portion 32. The manifold portion 32 according to the embodiment penetrates the protective substrate 30 in the thickness direction (Z direction), and is further formed over a width direction (+X direction) of the pressure generation chamber 12. The manifold portion 32 communicates with the communication portion 15 in the substrate 10. With these configurations, the manifold 100, which is the common ink chamber for each pressure generation chamber 12, is formed.

The protective substrate 30 has a piezoelectric element holding portion 31 formed in a region including the piezoelectric element 300. The piezoelectric element holding portion 31 has enough space not to interfere with movement of the piezoelectric element 300. This space may or may not be sealed. The protective substrate 30 is provided with a through hole 33 penetrating the protective substrate 30 in the thickness direction (Z direction). An end portion of each of the lead electrodes 90 is exposed in the through hole 33.

Examples of a material for the protective substrate 30 include Si, SOI, glass, a ceramic material, a metal, and a resin, and it is more preferable that the protective substrate 30 is formed of a material having substantially the same coefficient of thermal expansion as that of the substrate 10.

A drive circuit 120 functioning as a signal processing unit is fixed on the protective substrate 30. As the drive circuit 120, for example, a circuit board or a semiconductor integrated circuit (IC) can be used. The drive circuit 120 and the lead electrode 90 are electrically coupled to each other via a coupling wiring 121 made of a conductive wire such as a bonding wire inserted through the through hole 33. The drive circuit 120 can be electrically coupled to a printer controller 200 (see FIG. 1). Such a drive circuit 120 functions as a control unit for the piezoelectric actuator device (piezoelectric element 300).

On the protective substrate 30, a compliance substrate 40 including a sealing film 41 and a fixing plate 42 is bonded. The sealing film 41 is made of a material having low rigidity, and the fixing plate 42 can be made of a hard material such as a metal. A region of the fixing plate 42 facing the manifold 100 is an opening 43 with a part completely removed in the thickness direction (Z direction). One surface (a surface at a +Z direction side) of the manifold 100 is sealed only with the sealing film 41 having flexibility.

Such a recording head 1 ejects ink droplets by the following operation.

First, ink is taken in from an ink introduction port coupled to an external ink supply unit (not shown), and an inside of the recording head 1 is filled with ink from the manifold 100 to the nozzle openings 21. Thereafter, according to a recording signal from the drive circuit 120, a voltage is applied between the first electrode 60 and the second electrode 80 corresponding to each pressure generation chamber 12, and the piezoelectric element 300 is deflected and deformed. Accordingly, a pressure in each pressure generation chamber 12 is increased, and ink droplets are ejected from the nozzle openings 21.

Piezoelectric Element

Next, a configuration of the piezoelectric element 300 in the recording head 1 used as the piezoelectric actuator device will be described with reference to the drawings.

FIG. 5 is an enlarged cross-sectional view taken along a line B-B' in FIG. 4. As shown in the drawing, the piezoelectric element 300 includes the substrate (the substrate 10 and the elastic film 51) containing silicon, the first electrode 60 formed on the substrate containing silicon, the piezoelectric layer 70 formed on the first electrode 60 and containing potassium, sodium, and niobium, and the second electrode 80 formed on the piezoelectric layer 70.

The substrate 10 is provided with the pressure generation chambers 12 partitioned by a plurality of partition walls 11. With such a configuration, the movable portion of the piezoelectric element 300 is formed. A thickness of the first electrode 60 is about 50 nm to 300 nm. The piezoelectric layer 70 is a so-called thin-film piezoelectric substance having a thickness of 50 nm or more and 2000 nm or less. A thickness of the second electrode 80 is about 10 nm to 500 nm. Thicknesses of the elements described herein are merely examples, and can be changed without departing from the scope of the present disclosure.

A material for the first electrode 60 and a material for the second electrode 80 are preferably a noble metal such as platinum (Pt) or iridium (Ir) or an oxide thereof. The material for the first electrode 60 and the material for the second electrode 80 may be any material having conductivity. The material for the first electrode 60 and the material for the second electrode 80 may be the same or different.

The first diffusion inhibition layer 52 is disposed between the substrate 10 and the piezoelectric layer 70 in the Z direction. The first diffusion inhibition layer 52 contains an insulating material. The first diffusion inhibition layer 52 is preferably made of, for example, an insulating material containing zirconium. By using a material containing zirconium as the first diffusion inhibition layer 52, it is possible to further reduce diffusion of the alkali metal in the piezoelectric substance to a substrate 10 side. From such a viewpoint, the first diffusion inhibition layer 52 more preferably contains zirconium oxide ($ZrO_2$). The first diffusion inhibition layer 52 may contain only zirconium oxide ($ZrO_2$).

As will be described later, in the embodiment, a portion of the elastic film 51 is exposed in a region between the first electrode 60 and the first diffusion inhibition layer 52 that are arranged in the X direction. That is, a plurality of first diffusion inhibition layers 52 are arranged along the X direction via the exposed elastic film 51. Among the plurality of first diffusion inhibition layers 52, the first diffusion inhibition layer 52 disposed below the first electrode 60 may be omitted because there is no concern about element diffusion from the piezoelectric layer 70.

Here, in the related art, cracks may occur at boundary surfaces among a $ZrO_2$ film serving as the diffusion inhibition layer, the first electrode 60, and the piezoelectric layer 70. Specifically, cracks extending in a +Z direction occur from both end portions of the first electrode 60 in the X direction. This is considered to be because two contact interfaces of the piezoelectric layer 70, that is, an interface with the $ZrO_2$ film and an interface with the first electrode 60, are present, and a difference occurs in stresses generated at each interface. In particular, since $ZrO_2$ has a strong effect of reducing element diffusion, a change in physical properties becomes steep at the interface between the KNN-based piezoelectric layer 70 and the $ZrO_2$ film. That is, when a KNN-based material was used as the piezoelectric layer 70, a region including boundary surfaces among the $ZrO_2$ film, the first electrode 60, and the piezoelectric layer 70 became fairly brittle, and resistance to an external pressure such as vibration was lower than other regions.

Therefore, in the piezoelectric element 300 according to the embodiment, from the viewpoint of a change in physical properties at the contact interfaces of the piezoelectric layer 70, a difference in thermal expansion coefficients at the contact interfaces can be reduced.

Specifically, as shown in FIG. 5, when a surface 60*a* of the first electrode 60 is defined as a first region A1, a surface 52*a* of the first diffusion inhibition layer 52 is defined as a second region A2, and a surface 51*a* on the substrate containing silicon (in the case in FIG. 5, the elastic film 51) between the first region A1 and the second region A2 adjacent to each other in the X direction is defined as a third region A3, the piezoelectric layer 70 is continuously provided on the first region A1, the second region A2, and the third region A3. That is, in a plan view from the Z direction, a part of the elastic film 51 is exposed in a region between the first electrode 60 and the first diffusion inhibition layer 52, and an end portion 60*b* of the first electrode 60 is disposed on the exposed elastic film 51.

An interface at which the end portion 60*b* of the first electrode 60 and the piezoelectric layer 70 are in contact with each other is an interface at which a stress is likely to be concentrated. Therefore, by providing the substrate containing silicon (elastic film 51) below the interface, a difference in thermal expansion coefficients between the substrate containing silicon (elastic film 51) and the piezoelectric layer 70 can be reduced, and as a result, occurrence of cracks can be reduced.

A mechanism by which cracks can be reduced is presumed as follows.

First, from the viewpoint of reducing a difference in thermal expansion coefficients, the present inventors studied a material suitable for the substrate for the interface with the piezoelectric layer 70 using the KNN-based material.

FIGS. 8 and 9 are diagrams showing results of secondary ion mass spectrometer (SIMS) analysis for element distributions in the piezoelectric layer and in the substrate in Examples described later. FIG. 8 shows an analysis result of Example 1 using a $SiO_2$ substrate. FIG. 9 shows an analysis result of Comparative Example 1 using a $ZrO_2$ substrate ($ZrO_2$ film). FIGS. 8 and 9 show the analysis results from the piezoelectric layer toward the substrate, and show the analysis results toward a substrate side as an analysis time (horizontal axis) elapses.

In the case of Example 1 in which the $SiO_2$ substrate was used, as shown in FIG. 8, a concentration of potassium (K) or sodium (Na) constituting the piezoelectric substance tended to gradually decrease without rapidly decreasing even after passing through the interface with the piezoelectric layer (a definition of "interface" will be described later). Therefore, it is considered that when the $SiO_2$ substrate is used, constituent elements of the piezoelectric substance diffuse to a $SiO_2$ substrate side.

When such element diffusion occurs, formation of a compound in the substrate (particularly, a surface layer portion) and a change in physical properties in the vicinity of the interface are caused. As a result, it is presumed that a difference in thermal expansion coefficients between the piezoelectric layer and the $SiO_2$ substrate is reduced. A preferred manufacturing method for diffusing the constituent elements of the piezoelectric substance to the $SiO_2$ substrate side will be described later.

On the other hand, in a case of Comparative Example using the $ZrO_2$ substrate, as shown in FIG. 9, the concentration of potassium (K) or sodium (Na) constituting the piezoelectric substance tended to rapidly decrease after passing through the interface with the piezoelectric layer. From this, it is considered that when the $ZrO_2$ substrate is used, the constituent elements of the piezoelectric substance do not (or are unlikely to) diffuse to the substrate side. When the element diffusion does not occur, the formation of the compound as described above and the change in the physical properties in the vicinity of the interface cannot be caused, and the difference in the thermal expansion coefficients is not reduced.

From the above analysis results, it can be seen that $SiO_2$ is suitable as a material for the substrate (the substrate 10 or the elastic film 51 in FIG. 5) constituting the interface with the piezoelectric layer. By using the $SiO_2$ substrate as the substrate, the difference in thermal expansion coefficients between the piezoelectric layer and the $SiO_2$ substrate is reduced by the element diffusion, and as a result, the occurrence of cracks in the vicinity of the interface can be reduced.

Here, the "interface between the piezoelectric layer and the substrate" in the embodiment is defined as follows.

First, as shown in FIGS. 8 and 9, in the analysis results of SIMS, flat peak intensities of constituent elements (for example, silicon (Si)) of the substrate are averaged (arrow P), and a portion intersecting ½ of the intensities is defined as an interface 1 between the piezoelectric layer and the substrate. Next, a point at which the intensities start to drop from a flat peak intensity of the constituent element (for example, silicon (Si)) of the substrate is defined as an interface 2. In the embodiment, a region between the interface 1 and the interface 2 is defined as an "interface between the piezoelectric layer and the substrate".

Although the interface is generally defined as a specific surface, it is fairly difficult to accurately identify the interface between the piezoelectric layer and the substrate by SIMS analysis. Therefore, in the embodiment, it is assumed that the "interface between the piezoelectric layer and the substrate" has a certain width, and the region between the interface 1 and the interface 2 is defined as the "interface between the piezoelectric layer and the substrate".

Presence or absence of diffusion of the elements constituting the piezoelectric substance at the interface is determined based on the following criteria.

First, as shown in FIGS. 8 and 9, an average value of peak intensities of sodium (Na) and potassium (K) from start of SIMS analysis (analysis time: 0 second) to the interface 1 is obtained (arrow $Q_{Na}$ and arrow $Q_K$), and an intensity reduced by two digits from the average value is regarded as a point where the element disappears, that is, where no diffusion occurs (arrow $R_{Na}$ and arrow $R_K$).

When this definition is compared with FIG. 8, it can be seen that in Example 1, both sodium (Na) and potassium (K) diffuse beyond the interface and to an inside of the $SiO_2$ substrate.

On the other hand, in Comparative Example, as shown in FIG. 9, both sodium (Na) and potassium (K) disappear at the interface and do not diffuse to the substrate side.

The substrate containing silicon (in the case of FIG. 5, the elastic film 51) in the embodiment preferably contains $SiO_2$ from the viewpoint of the mechanism described above. More preferably, the substrate containing silicon is a substrate made of $SiO_2$.

The cracks occur in the vicinity of the interface with the piezoelectric layer 70. Therefore, the substrate containing silicon may be provided at least in the third region A3. In other words, a region other than an interface where stresses are likely to concentrate, such as an interface where the end portion 60*b* of the first electrode 60 and the piezoelectric layer 70 are in contact with each other, may not be formed of a substrate containing silicon. The second electrode 80 is greatly affected by occurrence of a crack. Therefore, in a region corresponding to a region for disposing the second electrode 80 (a region overlapping the second electrode 80 in the Z direction), a part of the substrate containing silicon may be exposed, and the substrate containing silicon may not be exposed over an entire circumference of the piezoelectric layer 70 in a plan view from the Z direction.

The piezoelectric layer 70 according to the embodiment is formed of a thin film as described above, and is formed by a solution method (also referred to as a liquid phase method or a wet method) such as a MOD method or a sol-gel method, or a gas phase method such as a sputtering method. In the embodiment, the piezoelectric layer 70 is a perovskite composite oxide represented by a general formula $ABO_3$ containing potassium (K), sodium (Na), and niobium (Nb), formed by a solution method. That is, the piezoelectric layer 70 contains a piezoelectric material made of a KNN-based composite oxide represented by the following formula (1).

$$(K_X,Na_{1-X})NbO_3 \quad (1)$$

$(0.1 \leq X \leq 0.9)$

The piezoelectric material constituting the piezoelectric layer 70 may be a KNN-based composite oxide, and is not limited to a composition represented by the above formula (1). For example, another metal element (additive) may be contained in a A site or a B site of potassium sodium niobate. Examples of such additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn) and copper (Cu).

One or more additives of this kind may be contained. In general, an amount of the additives is 20% or less, preferably 15% or less, and more preferably 10% or less with respect to a total amount of elements serving as a main component. By using the additive, it is easy to improve various characteristics to diversify the configuration and function, but presence of more than 80% of KNN is preferred from the viewpoint of exhibiting characteristics derived from KNN. Also in the case of a composite oxide containing these other elements, it is preferable that the composite oxide has an $ABO_3$ perovskite structure.

In the present description, the "perovskite composite oxide containing K, Na, and Nb" is "a composite oxide having an $ABO_3$ perovskite structure containing K, Na, and Nb", and is not limited to only a composite oxide having an $ABO_3$ perovskite structure containing K, Na, and Nb. That is, in the present description, the "perovskite composite oxide containing K, Na, and Nb" includes a piezoelectric material represented as a mixed crystal containing a composite oxide having an $ABO_3$ perovskite structure containing K, Na, and Nb (for example, the KNN-based composite oxide shown above) and another composite oxide having an $ABO_3$ perovskite structure.

The other composite oxide is not limited within the scope of the embodiment, and is preferably a non-lead-based piezoelectric material which does not contain lead (Pb). The other composite oxide is more preferably a non-lead-based piezoelectric material which does not contain lead (Pb) and bismuth (Bi). According to these, the piezoelectric element 300 is excellent in biocompatibility and has low environmental loading.

In the piezoelectric element 300 according to the first embodiment described above, the substrate containing silicon is provided below the interface at which the end portion 60*b* of the first electrode 60 and the piezoelectric layer 70 are in contact with each other, and thus diffusion of the constituent elements of the piezoelectric substance toward the $SiO_2$ substrate side occurs at the interface between the substrate containing silicon and the piezoelectric layer 70. When the element diffusion occurs, the formation of the compound and the change in the physical properties in the vicinity of the interface are caused. As a result, the difference in thermal expansion coefficients between the substrate containing silicon and the piezoelectric layer 70 is reduced, and the occurrence of cracks can be reduced.

In the first embodiment above, the ink jet recording head is described as an example of a liquid ejection head. However, the present disclosure is applicable to liquid ejection heads in general, and is also applicable to a liquid ejection head for ejecting a liquid other than ink. Examples of other liquid ejection heads include various recording heads used in image recording devices such as printers, color material ejection heads used for manufacturing color filters for liquid crystal displays, electrode material ejection heads used for forming electrodes for organic EL displays and field emission displays (FEDs), and bioorganic material ejection heads used for manufacturing biochips.

The present disclosure is not limited to the piezoelectric element mounted on the liquid ejection head, and can also be applied to a piezoelectric element mounted on another piezoelectric element application device. Examples of the piezoelectric element application device include an ultrasonic device, a motor, a pressure sensor, a pyroelectric element, and a ferroelectric element. Completed bodies using these piezoelectric element application devices, for example, an ejection device of a liquid or the like using an ejection head for the liquid or the like, an ultrasonic sensor using the ultrasonic device, a robot using the motor as a driving source, an IR sensor using the pyroelectric element, and a ferroelectric memory using the ferroelectric element are also in the piezoelectric element application device.

Modification 1

Next, a piezoelectric element 300A according to Modification 1 of the first embodiment will be described with reference to the drawings. In the following description, components having the same or similar functions as those in the first embodiment are denoted by the same reference signs. Repeated descriptions of these configurations may be omitted.

Figure 6:
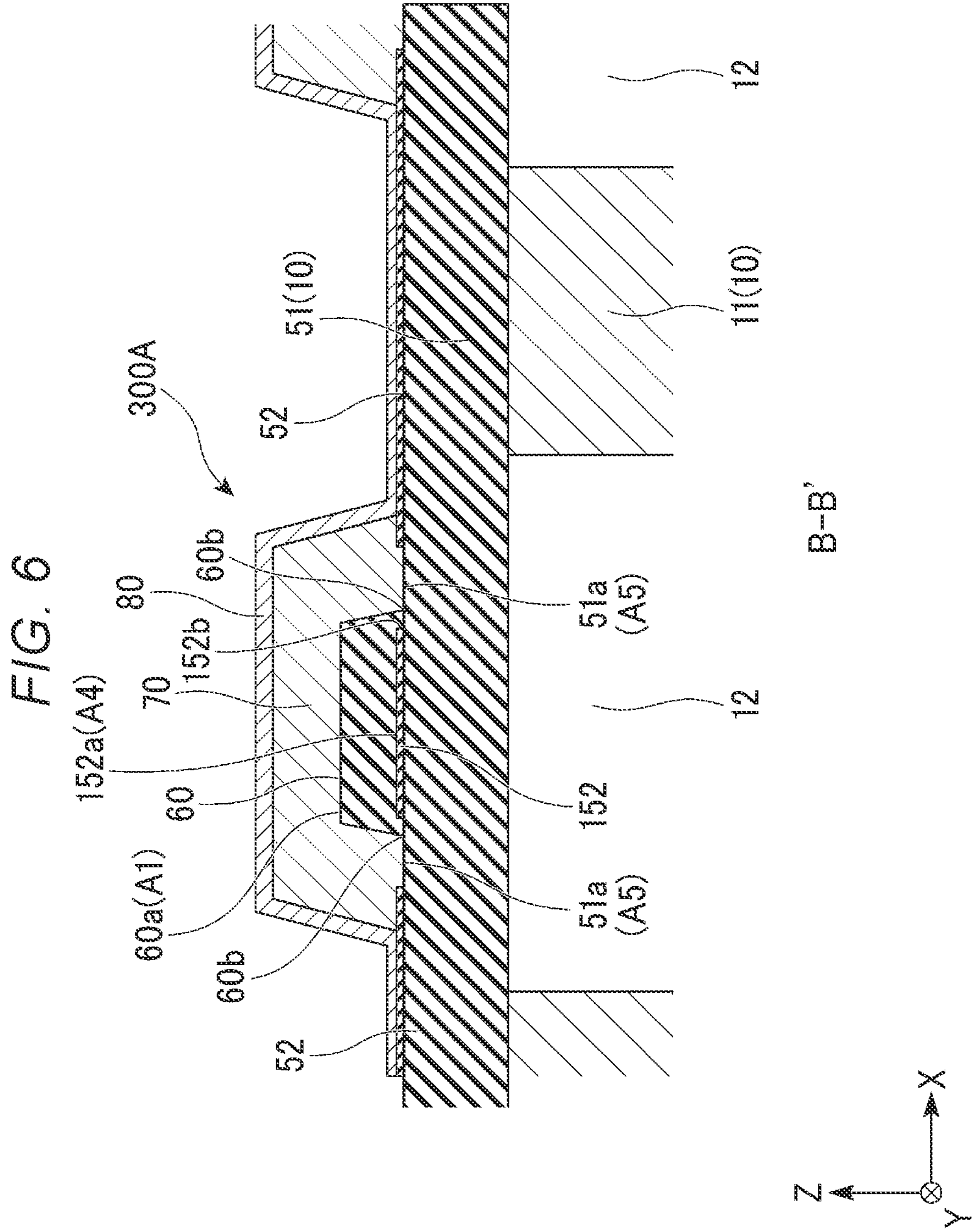
FIG. 6 is a cross-sectional view showing a piezoelectric element according to Modification 1.

FIG. 6 is an enlarged cross-sectional view taken along a line B-B' in FIG. 4. As shown in the drawing, in the modification, a first diffusion inhibition layer 152 is also disposed between the substrate containing silicon (the substrate 10 and the elastic film 51) and the first electrode 60. The first diffusion inhibition layer 152 may be disposed on a surface of the substrate containing silicon.

The first electrode 60 in the modification is continuously formed on a fourth region A4 which is a surface 152*a* of the first diffusion inhibition layer 152 and a fifth region A5 which is the surface 51*a* of the substrate. The fifth region A5 includes an end portion 152*b* of the first electrode 60. That is, the surface 152*a* and the end portion 152*b* of the first diffusion inhibition layer 152 are covered with the first electrode 60. When the end portion 152*b* of the first diffusion inhibition layer 152 is exposed from the end portion 60*b* of the first electrode 60 toward a piezoelectric layer 70 side, the exposed portion may cause a crack.

According to the piezoelectric element 300A having the configuration of Modification 1 as described above, the first diffusion inhibition layer 152 is also disposed between the first electrode 60 and the substrate containing silicon (the substrate 10 and the elastic film 51). Accordingly, it is possible to further reduce diffusion of the alkali metal in the piezoelectric layer 70 to the substrate side.

Modification 2

Next, a piezoelectric element 300B according to Modification 2 of the first embodiment will be described with reference to the drawings. In the following description, components having the same or similar functions as those in the first embodiment are denoted by the same reference signs. Repeated descriptions of these configurations may be omitted.

Figure 7:
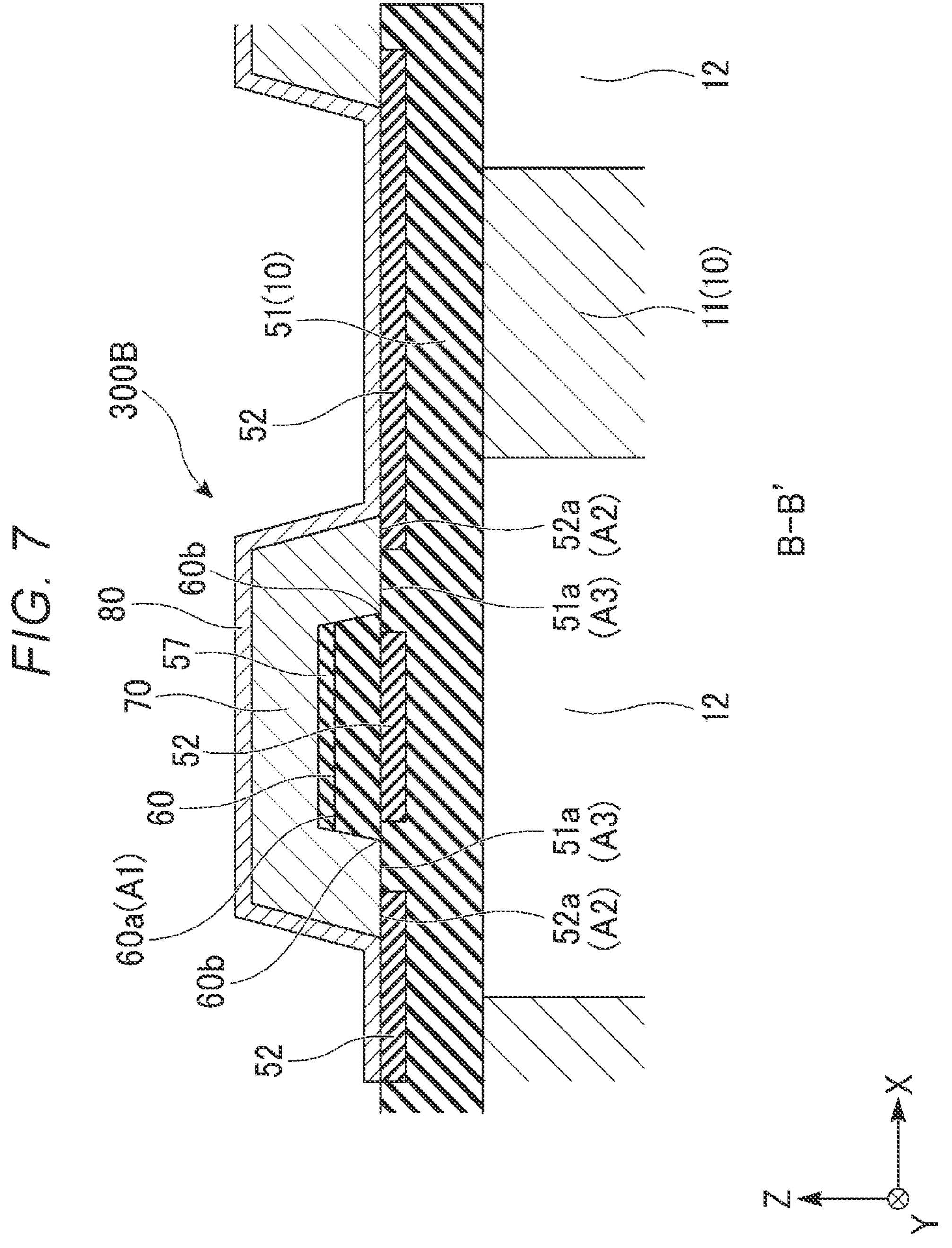
FIG. 7 is a cross-sectional view showing a piezoelectric element according to Modification 2.

FIG. 7 is an enlarged cross-sectional view taken along a line B-B' in FIG. 4. As shown in the drawing, in the modification, a second diffusion inhibition layer 57 is disposed between the first electrode 60 and the piezoelectric layer 70 in the Z direction. The second diffusion inhibition layer 57 is made of an insulating material. The second diffusion inhibition layer 57 is preferably made of, for example, a conductive material containing iridium (Ir). By using a material containing iridium as the second diffusion inhibition layer 57, it is possible to further reduce the diffusion of the alkali metal in the piezoelectric substance to the first electrode 60 and the substrate 10 side. From such a viewpoint, the second diffusion inhibition layer 57 more preferably contains iridium oxide ($IrO_2$). The second diffusion inhibition layer 52 may contain only iridium oxide ($IrO_2$).

Next, an example of a method for producing the piezoelectric element 300 will be described.

First, a substrate containing silicon (hereinafter, also referred to as a "wafer") is prepared, and by thermally oxidizing the substrate, the elastic film 51 made of silicon dioxide is formed at a surface of the substrate.

Next, a resist having a predetermined shape is formed as a mask in a region other than the region where the first diffusion inhibition layer 52 is formed on the elastic film 51, and the elastic film 51 is patterned. A zirconium film is formed in the patterned region by a sputtering method, and the zirconium film is thermally oxidized to form the first diffusion inhibition layer 52.

Next, on/above the elastic film 51 and the first diffusion inhibition layer 52, and the first electrode 60 are formed by a routine procedure (a sputtering method, a vapor deposition method, or the like), and are simultaneously patterned. The first electrode 60 may be formed via an adhesion layer (for example, titanium oxide).

Next, a plurality of layers of piezoelectric films overlap the elastic film 51 and the first diffusion inhibition layer 52 on/above the first electrode 60.

The piezoelectric layer 70 is implemented by the plurality of layers of piezoelectric films. The piezoelectric layer 70 can be formed by a solution method (chemical solution method) such as a MOD method or sol-gel method. By forming the piezoelectric layer 70 by the solution method thus, productivity of the piezoelectric layer 70 can be increased. The piezoelectric layer 70 formed by the solution method thus is formed by repeating a series of steps from a step of applying the precursor solution (applying step) to a step of firing the precursor film (firing step) a plurality of times.

A specific procedure for forming the piezoelectric layer 70 by the solution method is, for example, as follows.

First, a precursor solution containing a predetermined metal complex is prepared. The precursor solution is obtained by dissolving or dispersing a metal complex capable of forming a composite oxide containing K, Na, and Nb by firing in an organic solvent. At this time, a metal complex containing an additive such as Mn may be further mixed.

Examples of a metal complex containing K include potassium 2-ethylhexanoate and potassium acetate. Examples of a metal complex containing Na include sodium 2-ethylhexanoate and sodium acetate. Examples of a metal complex containing Nb include niobium 2-ethylhexanoate and pentaethoxyniobium. When Mn is added as the additive, examples of a metal complex containing Mn include manganese 2-ethylhexanoate. At this time, two or more kinds of metal complexes may be used in combination. For example, potassium 2-ethylhexanoate and potassium acetate may be used in combination as the metal complex containing K. Examples of a solvent include 2-n-butoxyethanol, n-octane, and mixed solvents thereof. The precursor solution may contain an additive which stabilizes dispersion of the metal complex containing K, Na, and Nb. Examples of such additives include 2-ethylhexanoic acid.

The precursor solution is applied onto the substrate 10 on/above which the elastic film 51, the first diffusion inhibition layer 52, and the first electrode 60 are formed to form a precursor film (applying step).

Next, the precursor film is heated at a predetermined temperature, for example, about 130° C. to 250° C. and is dried for a certain period of time (drying step).

A temperature increase rate in the drying step is preferably 30° C./sec to 350° C./sec. By firing the piezoelectric film at such a temperature increase rate using the solution method, the piezoelectric layer 70 which is not a pseudo-cubic crystal can be implemented. The term "temperature increase rate" as used herein defines a rate of change over time of a temperature from 350° C. to a target firing temperature.

Next, the dried precursor film is heated to a predetermined temperature, for example, 250° C. to 500° C., and is held at this temperature for a certain period of time to perform degreasing (degreasing step).

Examples of a heating device used in the drying step, the degreasing step, and the firing step include a rapid thermal annealing (RTA) device which performs heating by irradiation with an infrared lamp, and a hot plate. The above steps are repeated a plurality of times to form the piezoelectric layer 70 including a plurality of layers of piezoelectric films. In a series of steps from the applying step to the firing step, the firing step may be performed after repeating the steps from the applying step to the degreasing step a plurality of times.

Before and after the second electrode 80 is formed on the piezoelectric layer 70, a reheat treatment (post-annealing) may be performed in a temperature range of 600° C. to 800° C. as necessary. By performing the post-annealing thus, a good interface between the piezoelectric layer 70 and the first electrode and a good interface between the piezoelectric layer 70 and the second electrode 80 can be formed, and crystallinity of the piezoelectric layer 70 can be improved.

After the firing step, the piezoelectric layer 70 implemented with a plurality of piezoelectric films is patterned into a shape as shown in FIG. 5. Patterning can be performed by dry etching such as reactive ion etching or ion milling, or wet etching using an etchant.

Thereafter, the second electrode 80 is formed on the piezoelectric layer 70. The second electrode 80 can be formed by a similar method as the first electrode 60.

By the above steps, the piezoelectric element 300 including the first electrode 60, the piezoelectric layer 70, and the second electrode 80 is produced.

EXAMPLES

Hereinafter, the present disclosure will be described in more detail with reference to Examples, and the present disclosure is not limited to Examples.

Example 1

First, a surface of a silicon substrate (6 inches) serving as the substrate 10 was thermally oxidized, and the elastic film 51 made of silicon dioxide was formed on the substrate, and thereby obtaining a base substrate.

Next, the piezoelectric layer 70 was formed on the base substrate by the following procedure.

First, a precursor solution containing potassium 2-ethylhexanoate, sodium 2-ethylhexanoate, lithium 2-ethylhexanoate, niobium 2-ethylhexanoate, and manganese 2-ethylhexanoate was applied onto the base substrate by a spin coating method to form a precursor film (applying step).

Thereafter, the precursor film was dried at 180° C. (drying step), and then was degreased at 380° C. for 3 minutes (degreasing step).

Next, the degreased precursor film was subjected to a heat treatment at 700° C. for 3 minutes using rapid thermal annealing (RTA), and a piezoelectric film was formed (firing step). The steps from the applying step to the firing step were repeated a plurality of times until cracks were checked, thereby producing the KNN-based piezoelectric layer 70 made of a plurality of layers of piezoelectric films.

Comparative Example 1

In formation of the base substrate, a zirconium film was produced on the silicon dioxide film (elastic film 51) by a sputtering method and was thermally oxidized to produce a zirconium oxide film. The piezoelectric layer 70 was formed on the zirconium oxide film. The others were the same as those in Example 1.

Comparative Example 2

In formation of the base substrate, an $Al_2O_3$ film was produced on the silicon dioxide film (elastic film 51) by an ALD method. The piezoelectric layer 70 was formed on the $Al_2O_3$ film. The others were the same as those in Example 1.

Comparative Example 3

In formation of the base substrate, a $Ta_2O_5$ film was produced on the silicon dioxide film (elastic film 51) by a sputtering method. The piezoelectric layer 70 was formed on the $Ta_2O_5$ film. The others were the same as those in Example 1.

For the Examples and Comparative Examples described above, the following element diffusion and crack occurrence were checked. Results are shown in Table 1.

Checking Element Diffusion

Element diffusion was checked using a secondary ion mass spectrometry (SIMS) apparatus (IMS-7f sector type, manufactured by CAMECA). Primary ions were raster-scanned with Cs+ of 15 keV at a beam current of 10 nA of 100 μm square, and negative secondary ions were detected from a center of 33 μmφ. An electron gun was used to prevent charge-up.

Checking Crack

In dark-field observation using a metallurgical microscope, presence or absence of a crack was determined using an objective lens at a magnification of 50 times. Table 1 shows a total number of piezoelectric films stacked until a crack occurs.

TABLE 1

| | Material at contact interface with KNN | Total number of films until crack occurs |
|---|---|---|
| Example 1 | $SiO_2$ | Ten layers or more |
| Comparative Example 1 | $ZrO_2$ | Four layers |
| Comparative Example 2 | $Al_2O_3$ | Four layers |
| Comparative Example 3 | $Ta_2O_5$ | Five layers |

Test Results

From the results shown in Table 1, in the case of Example 1 in which $SiO_2$ was used as a substrate material, no crack occurred even when ten layers of piezoelectric films (KNN) were stacked. On the other hand, when $ZrO_2$, $Al_2O_3$, and $Ta_2O_5$ was used, cracks occurred in the number of stacking of 5 or less layers.

FIG. 8 shows the analysis result of Example 1 using the $SiO_2$ substrate. FIG. 9 shows the analysis result of Comparative Example 1 using the $ZrO_2$ substrate ($ZrO_2$ film).

As shown in FIG. 8, when $SiO_2$ is used as the substrate, it can be seen that potassium (K) and sodium (Na) which are constituent elements of KNN are in the substrate. That is, it can be seen that the constituent elements of the KNN diffuse from the interface into the substrate with an inclination.

From this, it can be seen that it is preferable to use $SiO_2$ as the material disposed at the contact interface with the piezoelectric layer in order to prevent occurrence of cracks.

What is claimed is:

1. A piezoelectric element comprising:
a substrate containing silicon;
a first electrode formed on the substrate;
a piezoelectric layer formed on the first electrode and containing potassium, sodium, and niobium; and
a second electrode formed on the piezoelectric layer, wherein
a first diffusion inhibition layer containing an insulating material is disposed between the substrate and the piezoelectric layer,
the piezoelectric layer is continuously formed on a first region which is a surface of the first electrode, a second region which is a surface of the first diffusion inhibition layer, and a third region which is a surface of the substrate, and
the third region is between the first region and the second region.

2. The piezoelectric element according to claim 1, wherein
the first diffusion inhibition layer contains zirconium.

3. The piezoelectric element according to claim 1, wherein
the first diffusion inhibition layer is disposed between the substrate and the first electrode,
the first electrode is continuously formed on a fourth region which is a surface of the first diffusion inhibition layer and a fifth region which is a surface of the substrate, and
the fifth region includes an end portion of the first electrode.

4. The piezoelectric element according to claim 1, wherein
a second diffusion inhibition layer containing iridium is disposed between the first electrode and the piezoelectric layer.

5. A piezoelectric element application device comprising:
the piezoelectric element according to claim 1.

* * * * *